United States Patent
Burke et al.

(10) Patent No.: US 7,081,794 B2
(45) Date of Patent: Jul. 25, 2006

(54) PARALLELING DIGITAL-INPUT AMPLIFIERS

(75) Inventors: Michael E. Burke, Morris Plains, NJ (US); Josef Ocenasek, Whippany, NJ (US); Jeffrey A. Siegel, Middletown, NJ (US)

(73) Assignee: Andrew Corporation, Westchester, IL (US)

( * ) Notice: Subject to any disclaimer, the term of this patent is extended or adjusted under 35 U.S.C. 154(b) by 104 days.

(21) Appl. No.: 10/861,045

(22) Filed: Jun. 4, 2004

(65) Prior Publication Data

US 2005/0270095 A1    Dec. 8, 2005

(51) Int. Cl.
*H03F 3/68*    (2006.01)
(52) U.S. Cl. .................. 330/124 R; 330/295
(58) Field of Classification Search ............ 330/124 R, 330/295, 51, 134, 291
See application file for complete search history.

(56) References Cited

U.S. PATENT DOCUMENTS

| | | | | |
|---|---|---|---|---|
| 5,304,943 A | * | 4/1994 | Koontz | 330/51 |
| 5,872,481 A | * | 2/1999 | Sevic et al. | 330/51 |
| 5,974,041 A | * | 10/1999 | Kornfeld et al. | 370/342 |
| 2003/0174018 A1 | * | 9/2003 | Cooper et al. | 330/124 R |
| 2005/0001674 A1 | * | 1/2005 | Saed et al. | 330/149 |

* cited by examiner

*Primary Examiner*—Henry Choe
(74) *Attorney, Agent, or Firm*—Steve Mendelsohn

(57) ABSTRACT

Two or more digital-input RF amplifiers are configured in parallel such that a combiner combines their respective outputs to generate a relatively large composite RF output signal. A feedback control architecture minimizes the phase differences between the various amplifier outputs so that the outputs can be efficiently combined. The feedback control can measure the return loss for each amplifier to determine how to adjust each amplifier's phase. In some embodiments, the feedback control can also measure the composite RF output signal for use in phase adjustment. In certain implementations, phase adjustment is implemented by an iterative coarse phase-adjustment mode (e.g., based on either the return loss or the composite output signal) followed by an iterative fine phase-adjustment mode (e.g., based on the return loss).

33 Claims, 6 Drawing Sheets

PARALLELING DIGITAL-INPUT AMPLIFIERS

FIELD OF THE INVENTION

The present invention relates to amplifiers, and, in particular, to techniques for combining the outputs of two or more RF amplifiers.

BACKGROUND OF THE INVENTION

Traditional radio frequency (RF) amplifiers boost low-power analog input signals to a higher power level. The outputs of traditional RF amplifiers manufactured with similar operating characteristics can be electrically combined to provide greater power output. The ability to configure such RF amplifiers in parallel can provide increased reliability through redundancy, while also offering greater flexibility by enabling different power levels to be provided by parallel amplifier configurations having different numbers of instances of a single basic amplifier design.

FIG. 1 shows a high-level block diagram of a prior-art amplifier system 100, in which two traditional RF amplifiers 106 and 108 are configured in parallel to produce a higher collective power output. An RF input signal from RF source 102 is divided equally by 1:2 splitter 104, where the split signals are fed through equal cable lengths to amplifier 106 and amplifier 108, respectively. The output signals from amplifier 106 and amplifier 108 are then fed through equal-length cables to 2:1 combiner 110 to generate the system's amplified RF output signal.

For RF amplifiers designed to have the same group delay, insertion phase, and gain, as long as the delay caused by the associated cable lengths are equal, the outputs can be near losslessly combined to produce a composite RF output signal.

BRIEF DESCRIPTION OF THE DRAWINGS

Other aspects, features, and advantages of the present invention will become more fully apparent from the following detailed description, the appended claims, and the accompanying drawings.

DETAILED DESCRIPTION

According to certain embodiments of the present invention, a digital input signal is applied equally to two or more amplifiers, and the collective outputs of the amplifiers are combined to produce a composite RF output signal. The composite RF output signal is optimized by control circuitry characterized by a feedback system for dynamically adjusting the phase angles of the signals processed by one or more and possibly all of the amplifiers in the system in order to minimize the loss in the subsequent amplifier-output combiner.

Figure 2:
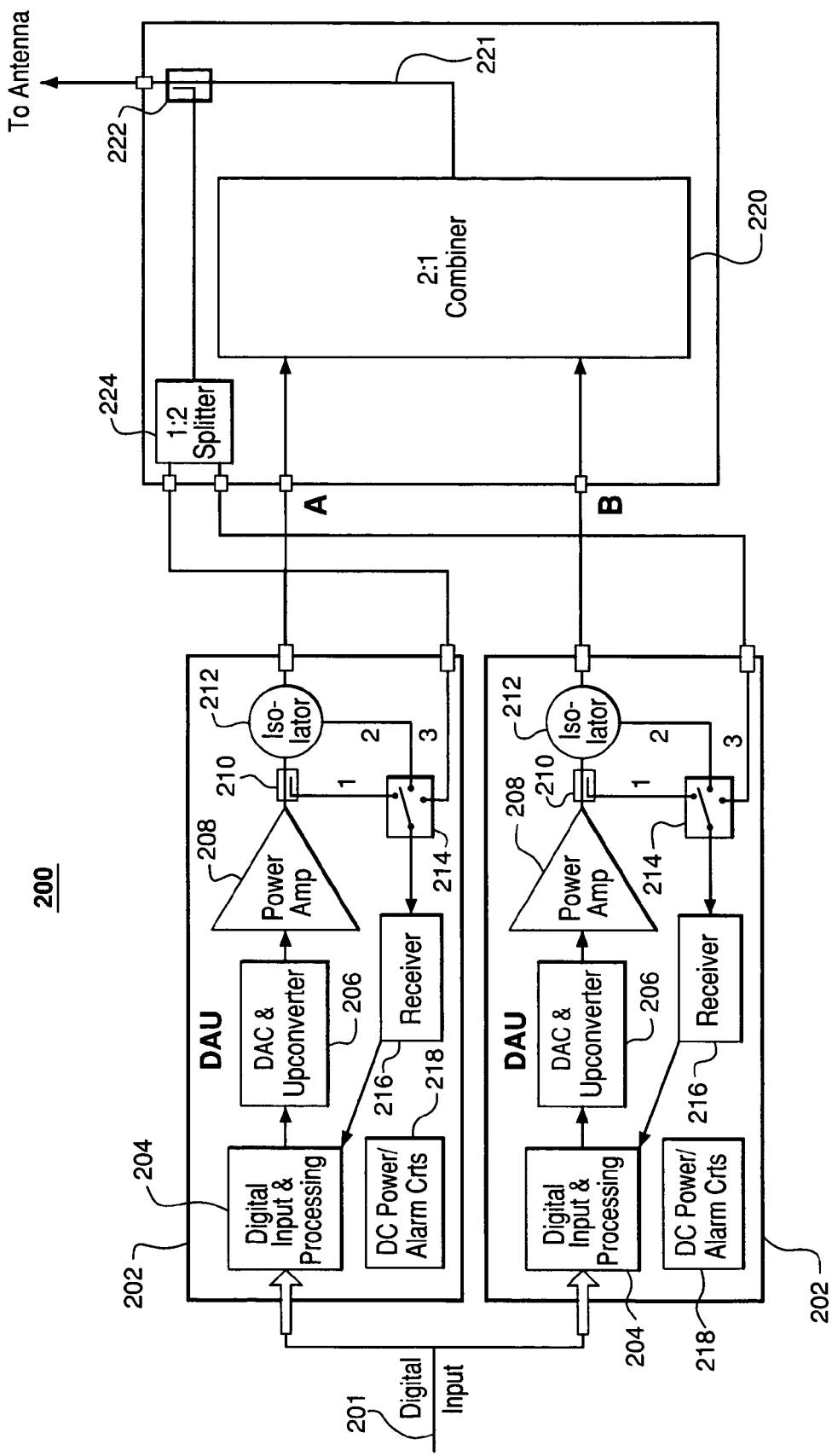
FIG. 2 is a high-level block diagram of a digital-input amplifier system, according to one embodiment of the present invention.

FIG. 2 shows a high-level block diagram of a digital-input amplifier system 200, according to one embodiment of the present invention. The amplifier system shown in FIG. 2 has a digital input signal path that delivers the same signal to two digital-input amplifiers (DAUs) 202 that are configured in parallel. Each DAU has a digital input processor 204, a digital-to-analog converter (DAC)/upconverter 206, a power amplifier 208, a directional coupler 210, an isolator 212, a three-pole switch 214, a receiver 216, and a DC power and alarm circuit 218. In addition, amplifier system 200 includes 2:1 combiner 220, directional coupler 222, and 1:2 splitter 224.

Although amplifier system 200 has two DAUs configured in parallel, those skilled in the art will understand that the principles of the invention can be extended to apply to parallel configurations having any other number N of DAUs greater than two. Such configurations would be implemented using a 1:N splitter and an N:1 combiner in place of 1:2 splitter 224 and 2:1 combiner 220, respectively.

In operation, an identical copy of digital input signal 201 is applied to each DAU 202 in amplifier system 200. Within each DAU 202, the applied digital signal is phase-adjusted by digital input processor 204. When the digital input signal is a baseband signal represented by in-phase (I) and quadrature-phase (Q) components, the phase can be adjusted in the digital domain according to Equation (1) as follows:

$$\text{Signal}_{(phase-adjusted)} = (I+jQ)*(a+jb) \qquad (1)$$

where $(a+jb)$ is the complex phase-adjustment term. In general, a complex adjustment term $(a+jb)$ can be rewritten as $Ae^{j\phi}$, where A is the amplitude of the adjustment and $\phi$ is the phase of the adjustment. If only phase adjustment is required with no change in the output amplitude, then the magnitude A of $(a+jb)$ is 1. In this case, $a=\cos(\phi)$ and $b=\sin(\phi)$.

Although phase is adjusted in the digital domain in amplifier system 200, in general, the phase can be adjusted in the digital domain or the analog domain and/or at baseband, at an intermediate frequency (IF), or at RF, either before or after amplification by power amplifier 208. Depending on the particular implementation, (I,Q) vector modulators or analog phase adjusters could be used to adjust the phase.

When, as in FIG. 2, phase adjustment is implemented in the digital domain at baseband, the phase-adjusted signal is subsequently converted to an analog voltage and upconverted to an RF frequency by DAC/upconverter 206, then amplified by power amplifier 208.

The outputs from the various DAUs 202 are combined at combiner 220 to form a composite RF output signal 221, for example, for forwarding to an antenna for wireless transmission.

Figure 1:
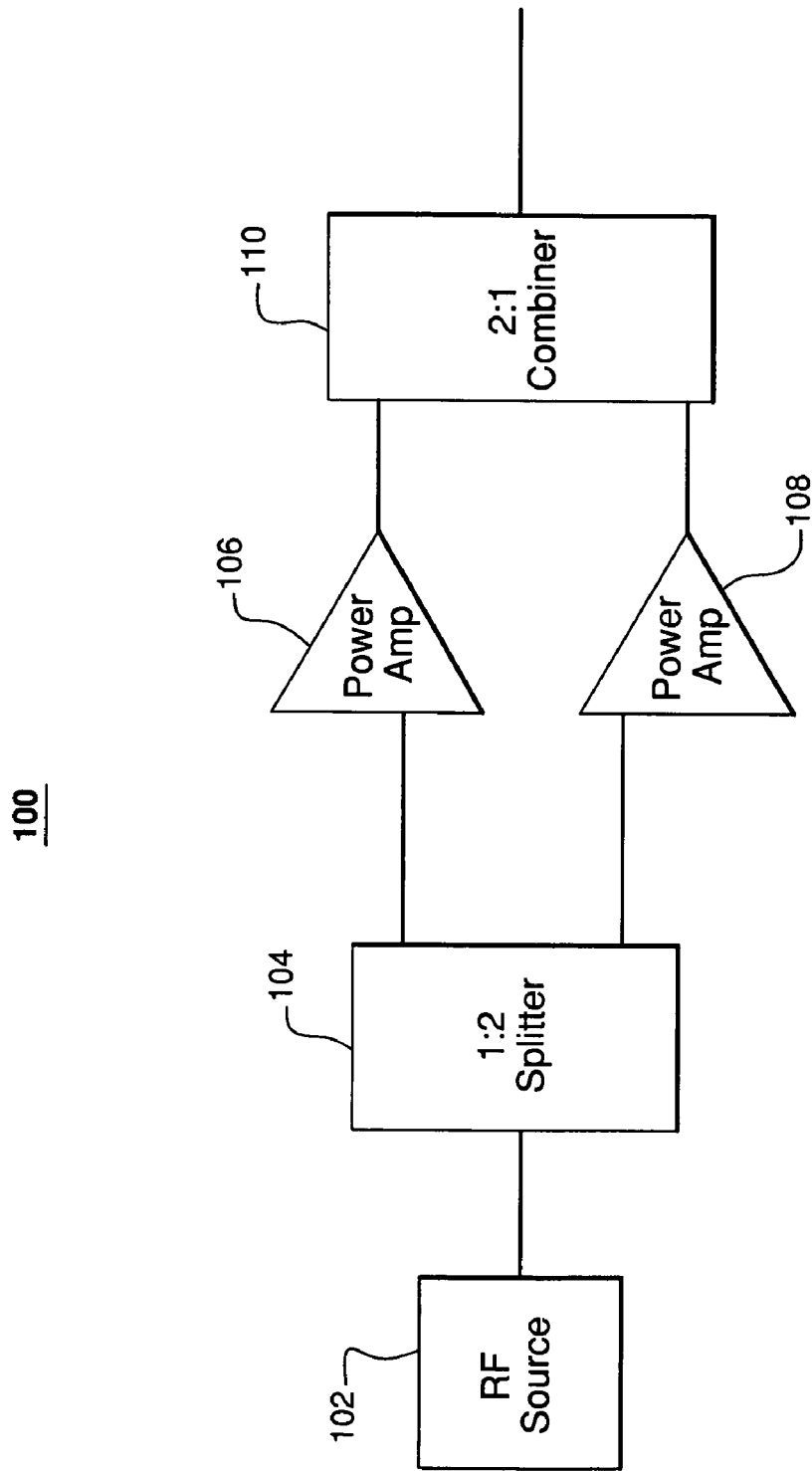
FIG. 1 is a high-level block diagram of traditional RF amplifiers combined in parallel.

Unlike traditional RF amplifiers, such as RF amplifiers 106 and 108 of FIG. 1, which can be effectively configured in parallel if group delay, insertion phase, gain, and inherent delay due to cable lengths are equal, the RF outputs of digital-input amplifiers cannot be effectively combined in the same manner. This is largely due to the fact that digital-input amplifiers generate RF signals internally, thereby resulting in randomness of the phases of the RF signals between different amplifiers.

As such, amplifier system 200 is designed with control circuitry for dynamically controlling the phase angle of the RF signal generated by each amplifier in the system in order to minimize the phase differences between the different DAU output signals, thereby maximizing the efficiency of the subsequent DAU-output combination at combiner 220.

In particular, feedback paths in each DAU 202 allow each amplifier to independently monitor (i) the power transmitted from the amplifier, (ii) the power reflected back along its own output path as a result of phase/power mismatches at combiner 220, and (iii) the composite RF output power of all of the amplifiers in the system. In particular, part of the amplified signal transmitted from each DAU is diverted at directional coupler 210 to Pole 1 of switch 214. In addition, any reflected signal from combiner 220 is diverted by isolator 212 and applied to Pole 2 of switch 214. Lastly, part of composite RF output signal 221 is diverted at directional coupler 222, divided at splitter 224, and applied to Pole 3 of switch 214.

Within each DAU, switch 214 selectively applies one of its three inputs to receiver 216, which generates control signals for digital input processor 204 based on the selected signals from switch 214. As described subsequently, amplifier system 200 supports two phase-adjustment modes of operation: a coarse-adjustment mode and a fine-adjustment mode. When operating in the coarse-adjustment mode, switch 214 is controlled to select the input signal corresponding to the composite RF output power at Pole 3.

When operating in the fine-adjustment mode, switch 214 is controlled to select the input signal corresponding to the reflected power at Pole 2. The measured reflected power level is used to determine the return loss for the DAU, according to Equation (2) as follows:

$$\text{Return loss} = \text{Reflected power/Transmitted power}, \quad (2)$$

where the transmitted power is determined based on the digital input signal. Although this linear return loss is often expressed in dB according to Equation (3) as follows:

$$\text{Return loss (dB)} = 10*\log \{\text{Return loss (linear)}\}, \quad (3)$$

for computational efficiency, the present invention preferably uses the linear return loss. In alternative implementations, the transmitted power can be measured by controlling switch 214 to select the signal corresponding to the amplifier output signal at Pole 1.

Figure 3:
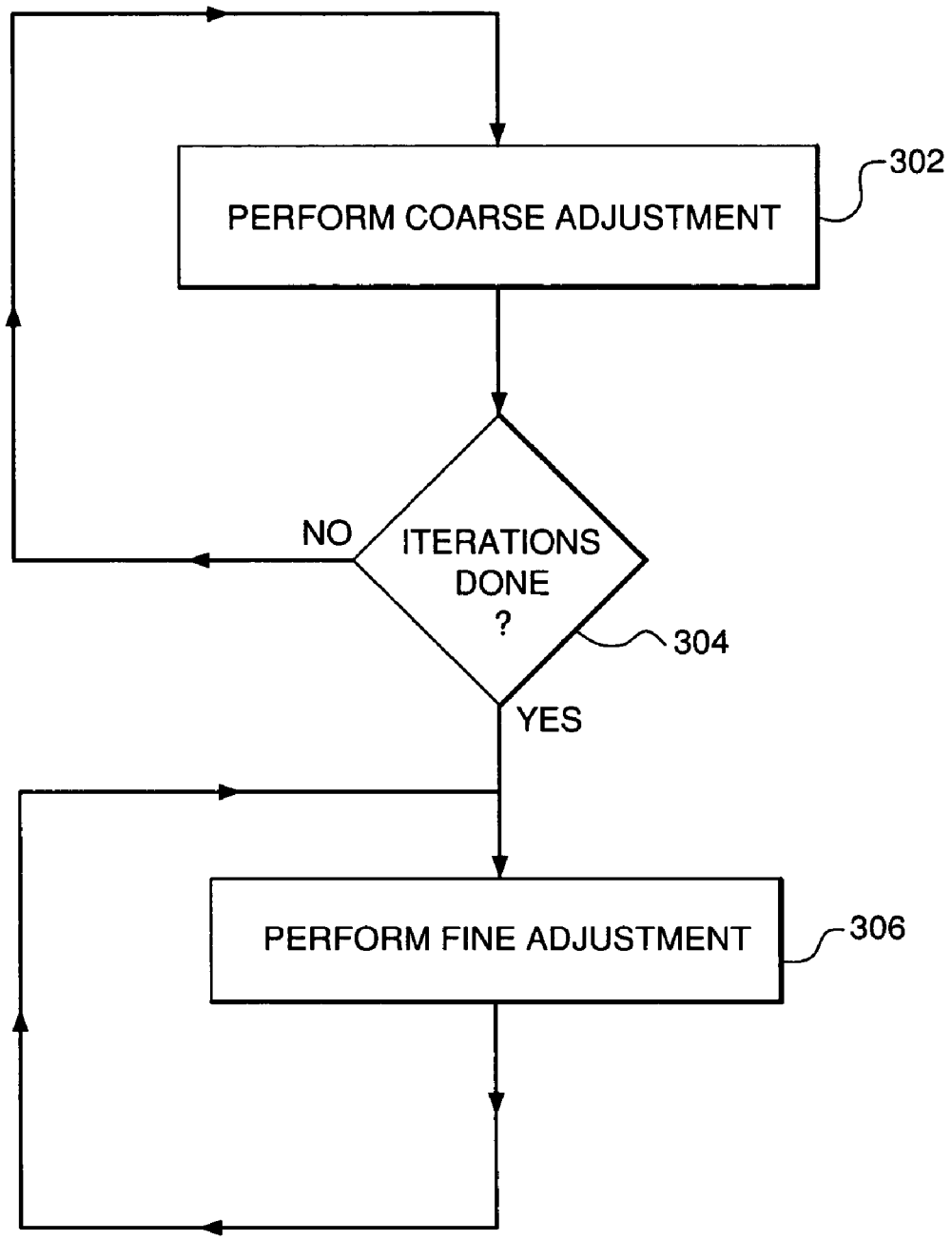
FIG. 3 shows a high-level flow diagram of a method for adjusting the phase for one of the digital-input amplifiers of the amplifier system shown in FIG. 2, according to one embodiment of the present invention.

FIG. 3 shows a high-level flow diagram of a method for adjusting phase for one of the digital-input amplifiers of amplifier system 200 shown in FIG. 2, according to one embodiment of the present invention. As indicated in FIG. 3, this method is an iterative approach, in which the DAU performs coarse phase adjustments one or more times followed by iterations of the DAU performing fine phase adjustments. Course phase adjustments are initiated when the output state of the DAU transitions from off to on. Fine phase adjustments follow and further refine the phase settings of the DAU.

Each DAU independently determines whether it should be in coarse-adjustment mode or fine-adjustment mode. Since the output state of each DAU may change independent of the other DAUs, at any given time, (1) all of the DAUs may be in coarse-adjustment mode, (2) all of the DAUs may be in fine-adjustment mode, or (3) one or more of the DAUs may be in coarse-adjustment mode, while the rest are in fine-adjustment mode.

The phase adjustments, whether coarse or fine, can be performed by one DAU at a time, e.g., in a round-robin fashion. Sequencing between DAUs can be accomplished in a number of ways. In one technique, all of the DAUs are time synchronized, and each DAU is assigned a different time slot with adequate duration in which to perform a particular phase adjustment. Other schemes such as token-passing can also be used to implement the round-robin sequence.

Phase adjustments (whether coarse or fine) are performed at each DAU by taking a first power measurement at the initial phase setting (e.g., the DAU's phase setting from the previous iteration), a second power measurement with the phase decreased relative to the initial phase setting, and a third power measurement with the phase increased relative to the initial phase setting. The phase setting that yields the best results is selected as the new phase setting for that DAU. The value used to increase or to decrease the phase setting when obtaining measurements is implementation specific, as is the number of iterations that can occur during either adjustment mode. For example, in one possible implementation, coarse-adjustment processing is performed for a DAU a total of four times with 30-degree phase shifts followed by continuous fine-adjustment processing with 4-degree phase shifts. Other implementations can have other numbers of iterations and/or other phase-shift increments.

As indicated for the embodiment of FIG. 3, the phase-adjustment process for a particular DAU begins by performing course phase-adjustment processing (e.g., during the DAU's assigned time slot) (step 302). After the currently selected DAU has completed its course phase-adjustment processing, a test (step 304) is performed to determine whether the specified number of coarse-adjustment iteration cycles have executed. If not, processing returns to step 302 to repeat the course-adjustment procedure for the DAU (e.g., during its next assigned time slot). Otherwise, the fine-adjustment process begins in step 306. According to this implementation, fine-adjustment processing is implemented indefinitely (e.g., until the output state of the DAU transitions from on to off), with the DAU performing the fine-adjustment process during each of its assigned time slots.

Figure 4:
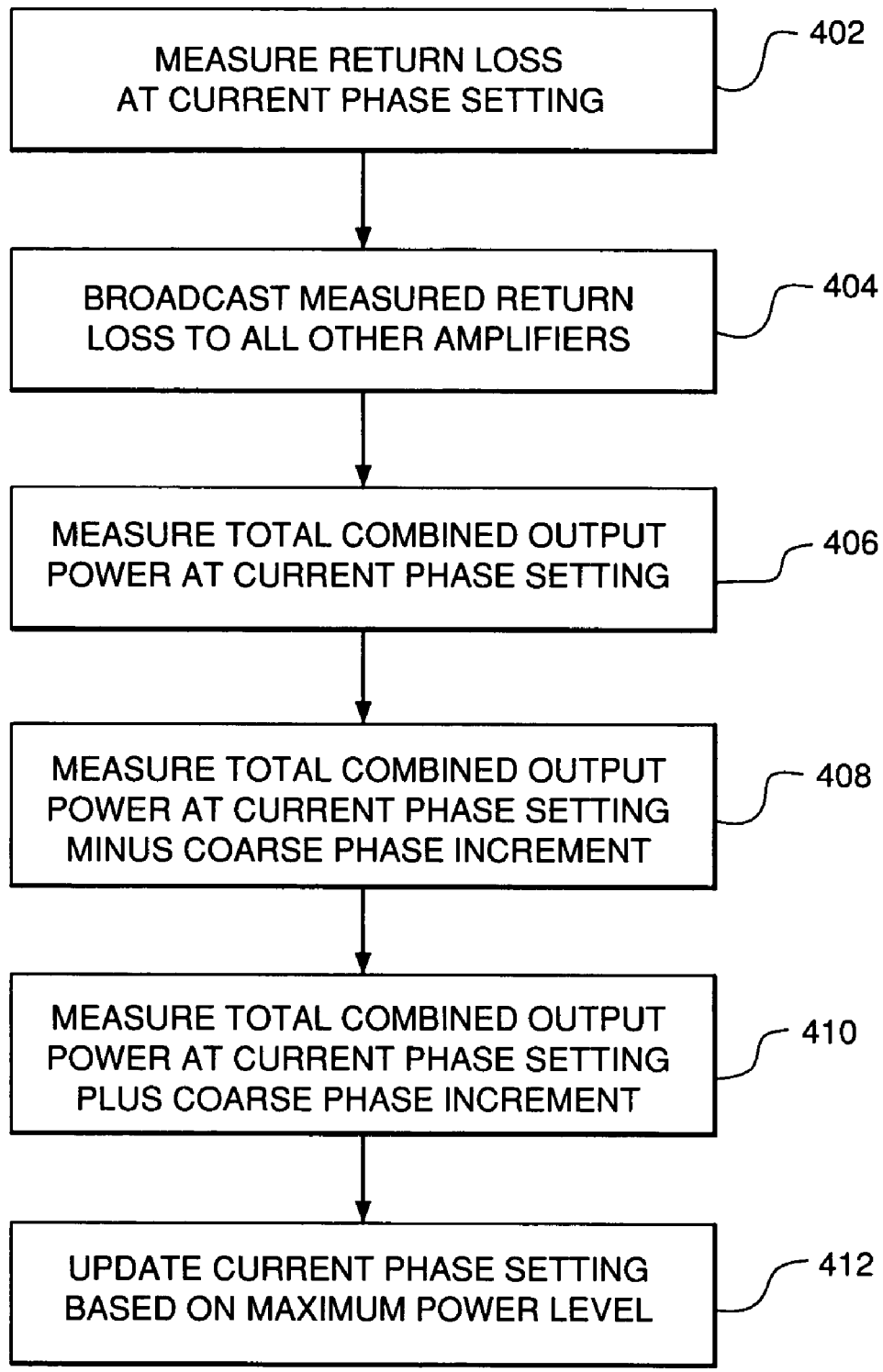
FIG. 4 is a flow diagram detailing the course-adjustment procedure depicted in step 302 of FIG. 3.

Reference is now made to FIG. 4, which describes the coarse phase-adjustment process for each DAU (i.e., step 302 of FIG. 3). Beginning with step 402, the return loss for the current DAU is determined at the current phase setting. As described earlier, this involves measuring the reflected power level at Pole 2 of switch 214 of FIG. 2. At step 404, the current DAU broadcasts the measured return loss to all of the other amplifiers in the system (e.g., via Ethernet, RS-485, or other suitable communication scheme). As described subsequently with respect to FIG. 5, this power level is used by each of the other DAUs (if any) that is currently operating in the fine-adjustment mode.

At step 406, with Pole 3 of switch 214 of FIG. 2 selected, the composite RF output power is measured at the current ("initial") phase setting. In step 408, the phase is reduced by the coarse phase increment (e.g., 30 degrees), and the composite RF output power is measured again. In step 410, the phase is increased to the initial phase setting plus the coarse phase increment (e.g., 30 degrees), and the composite RF output power is measured once more. In step 412, the current phase setting for the current DAU is updated based on the phase setting that maximizes the composite RF output power. Note that, if the composite RF output power levels at the decreased and increased phase settings are both less than the composite RF output power level at the initial phase setting, then the phase setting for the current DAU will not be changed.

Figure 5:
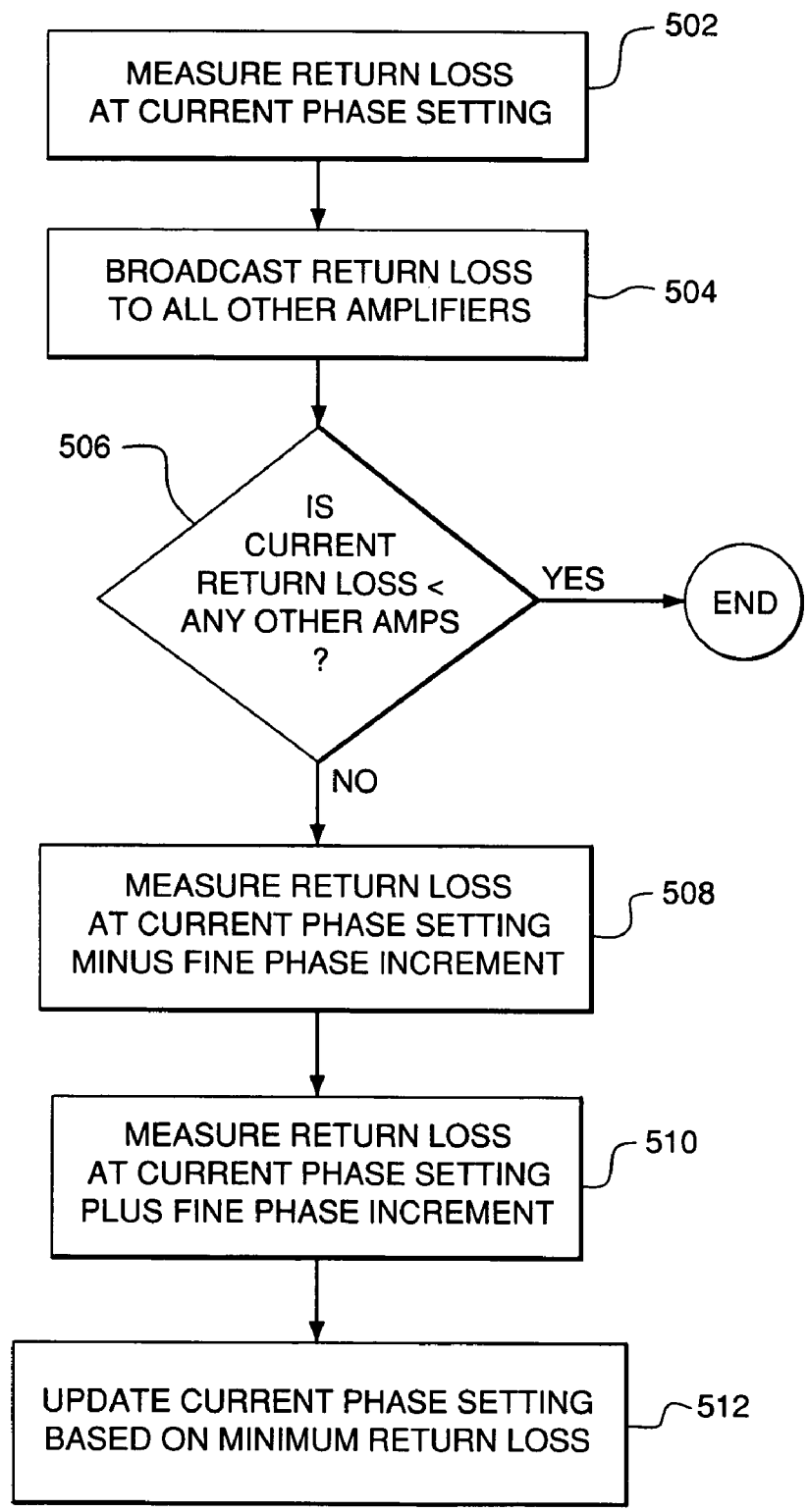
FIG. 5 is a flow diagram detailing the fine-adjustment procedure depicted in step 306 of FIG. 3.

Reference is now made to FIG. 5, which describes the fine phase-adjustment process for each DAU (i.e., step 306 of FIG. 3). In steps 502 and 504, similar to steps 402 and 404 of FIG. 4, the currently selected DAU measures and broadcasts its return loss at its current phase setting to all of the other DAUs.

A test (step 506) is performed to determine if the current DAU requires phase adjustment. If the current DAU is already outperforming any of the other DAUs (e.g., if the return loss at its current ("initial") phase setting is less than the return loss of any other DAU), then it is determined that the phase of the current DAU does not need to be adjusted and processing terminates.

Otherwise, in step 508, the phase is reduced based on the fine-adjustment increment (e.g., 4 degrees less than the initial phase setting), and the return loss is measured again. In step 510, the phase is increased based on the fine-adjustment increment (e.g., 4 degrees more than the initial phase setting), and the return loss is measured once more. In step 512, the current phase setting for the current DAU is updated based on the phase setting that minimizes the return loss. Analogous to the coarse-adjustment mode, if the return loss levels at the decreased and increased phase settings are both greater than the return loss level at the initial phase setting, then the phase setting for the current DAU will not be changed.

Figure 6:
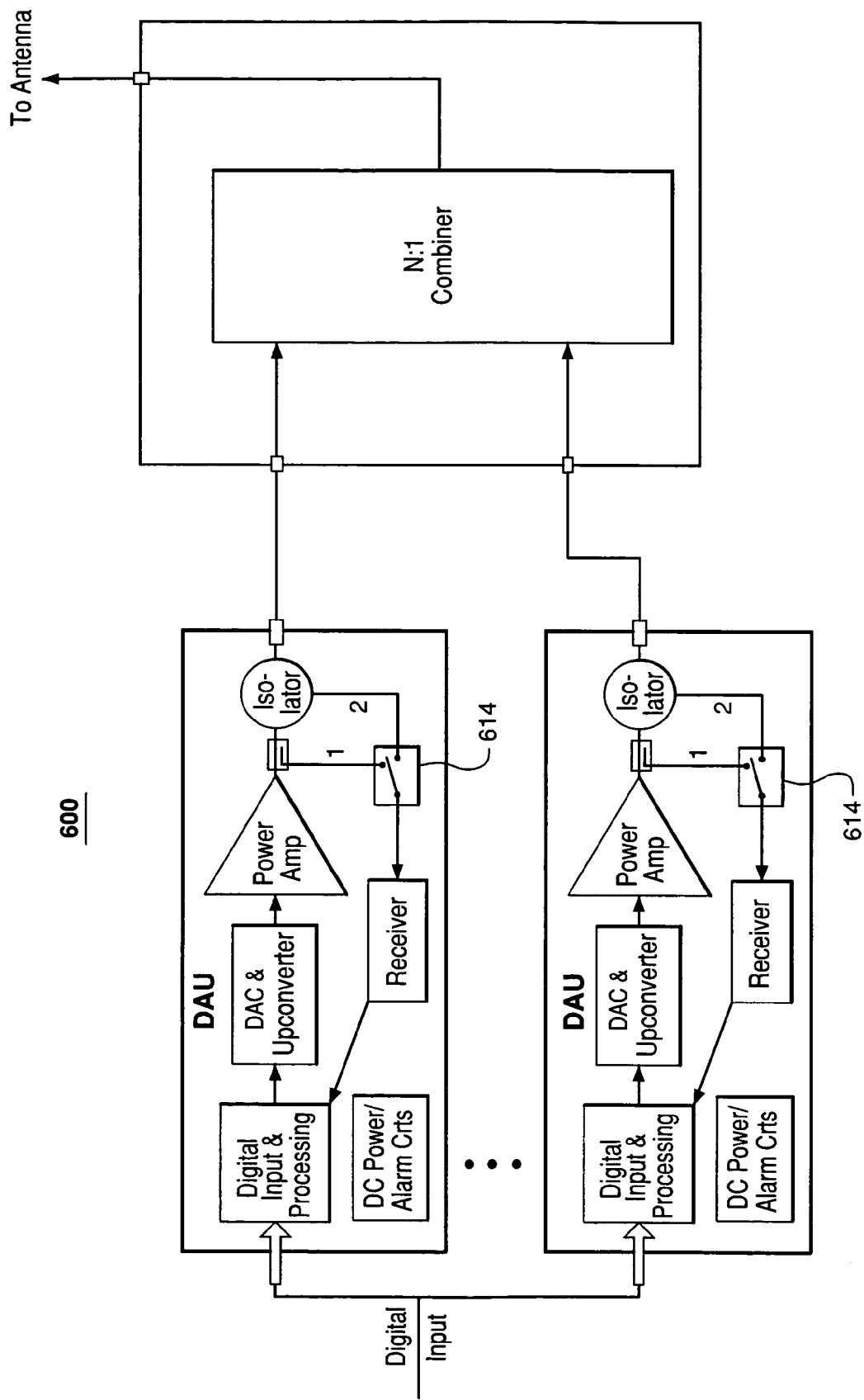
FIG. 6 is a high-level block diagram of a digital-input amplifier system, according to an alternative embodiment of the present invention.

FIG. 6 shows a high-level block diagram of a digital-input amplifier system 600, according to another embodiment of the present invention. Amplifier system 600 is analogous to amplifier system 200 of FIG. 2. One difference between the two systems is that all of the phase adjustments in amplifier system 600 are based only on the return loss levels derived from the reflected signal power levels applied to Pole 2 of switches 614. As such, amplifier system 600 can be implemented without a directional coupler (such as directional coupler 222 of FIG. 2), without a splitter (such as splitter 224 of FIG. 2), without the cabling and interfaces associated with those elements, and using two-pole switches 614, instead of three-pole switches (such as switches 214 of FIG. 2).

The method of operating amplifier system 600 can be based on the same overall processes shown in FIGS. 3-5, minimizing the return loss levels for both the coarse-adjustment and the fine-adjustment modes.

Additional Alternative Embodiments

Since the present invention can be used to minimize the phase differences between the RF signals generated by the different DAUs in a parallel amplifier configuration, it may be possible to implement one of the DAUs without any feedback system that controls the phase of its output RF signal. Alternatively, a DAU having a phase-adjustment feedback system could be operated with that feedback system disabled. In either case, the one or more other DAUs in the configuration can be tuned to minimize the phase differences between their RF outputs and the RF output of that first DAU.

In the embodiments shown in FIGS. 2 and 6, the controller performing measurements and phase adjustments resides within each DAU. In alternative implementations, the controller could be external to the individual amplifiers.

The present invention has been described in the context of the embodiments of FIGS. 2 and 6, which rely on two phase-adjustment modes. In alternative embodiments, the invention can be implemented using only one mode or more than two modes, where each mode is distinguished, for example, by the feedback signal used and/or the phase-adjustment increment applied.

Although the present invention has been described in the context of phase-adjustment modes that select the best of three different phase settings, other embodiments may involve less than three or more than three different phase settings for each iteration of each mode.

Although the present invention has been described in the context of the embodiment of FIG. 2, which uses the composite RF output signal and the return loss as feedback signals, and the embodiment of FIG. 6, which uses the return loss as its only feedback signal, the invention is not so limited. In general, other feedback signals and other combinations of feedback signals can be used. For example, it may be possible to implement the present invention using the reflected signal power levels directly without having to generate the return loss.

In the embodiment of FIG. 6, the return loss that is broadcast to the other DAUs is the return loss associated with the initial phase setting. In alternative embodiments, the DAUs can broadcast a different value, such as the return loss associated with the updated phase setting.

While the present invention has been described in the context of embodiments that rely on feedback signals from the combiner to adjust the phase of the amplified signals, in alternative embodiments, the gain of the amplified signals may also be adjusted based on feedback signals from the combiner.

While the present invention has been described in the context of RF signals, the present invention can also be implemented for signals having other frequencies, such as microwave frequency or higher.

Embodiments of the present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method for generating a composite output signal using a plurality of digital-input amplifiers configured in parallel, the method comprising:
applying a digital input signal to each of the amplifiers to generate an amplified signal;
combining the amplified signal from each of the amplifiers to generate the composite output signal; and
adjusting phase of the amplified signal generated by each of one or more of the amplifiers based on one or more feedback signals associated with the combining, wherein:
one or more phase adjustments are implemented during an initial phase-adjustment mode; and
one or more other phase adjustments are implemented during a subsequent phase-adjustment mode, wherein the initial phase-adjustment mode has a larger phase-adjustment increment than the subsequent phase-adjustment mode.

2. The invention of claim 1, wherein:
a first feedback signal is based on a return loss for an amplifier; and
one or more phase adjustments are adapted to reduce the return loss for the amplifier.

3. The invention of claim 2, wherein:
a second feedback signal is based on the composite output signal; and
one or more other phase adjustments are adapted to increase the power level of the composite output signal.

4. The invention of claim 1, wherein the initial phase-adjustment mode is applied to one or more of the amplifiers for a specified number of iterations followed by application of the subsequent phase-adjustment mode to the one or more amplifiers for an indefinite number of iterations.

5. The invention of claim 1, wherein, for each iteration of each phase-adjustment mode for each amplifier:
feedback signals at an initial phase setting, a reduced phase setting, and an increased phase setting are measured; and
an updated phase setting for the amplifier is based on the measured feedback signals.

6. The invention of claim 5, wherein, when the feedback signals are based on a return loss for the corresponding amplifier, the updated phase setting is associated with a lowest measured return loss.

7. The invention of claim 6, wherein, when the feedback signals are based on the composite output signal, the updated phase setting is associated with a highest measured composite output signal power level.

8. The invention of claim 1, wherein, for each iteration of each phase-adjustment mode for each amplifier, infomation related to the amplifier is transmitted to one or more other amplifiers.

9. The invention of claim 8, wherein the information is based on a return loss for the amplifier.

10. The invention of claim 1, wherein phase adjustment during the subsequent phase-adjustment mode is skipped for each amplifier that is performing better than any other of the amplifiers, wherein a first amplifier is performing better than a second amplifier when a return loss for the first amplifier is less than a return loss for the second amplifier.

11. The invention of claim 1, wherein phase adjustment is applied to the digital input signal at baseband in a digital domain prior to application to the corresponding amplifier.

12. An apparatus for generating a composite output signal using a plurality of digital-input amplifiers configured in parallel, the apparatus comprising:
means for applying a digital input signal to each of the amplifiers to generate an amplified signal;
means for combining the amplified signal from each of the amplifiers to generate the composite output signal; and
means for adjusting phase of the amplified signal generated by each of one or more of the amplifiers based on one or more feedback signals associated with the combining, wherein:
one or more phase adjustments are implemented during an initial phase-adjustment mode; and
one or more other phase adjustments are implemented during a subsequent phase-adjustment mode, wherein the initial phase-adjustment mode has a larger phase-adjustment increment than the subsequent phase-adjustment mode.

13. An amplifier system comprising:
a plurality of digital-input amplifiers, each adapted to generate an amplified signal based on a digital input signal;
a combiner adapted to receive the amplified signals from the amplifiers and generate a composite output signal; and
control circuitry adapted to adjust phase of one or more of the amplified signals based on one or more feedback signals from the combiner wherein:
the control circuitry is adapted to implement one or more chase adjustments during an initial phase-adjustment mode; and
the control circuitry is further adapted to implement one or more other phase adjustments during a subsequent phase-adjustment mode, wherein the initial phase-adjustment mode has a larger phase-adjustment increment than the subsequent phase-adjustment mode.

14. The invention of claim 13, wherein:
a first feedback signal is based on a return loss for an amplifier; and
the control circuitry is adapted to implement one or more phase adjustments to reduce the return loss for the amplifier.

15. The invention of claim 14, wherein:
a second feedback signal is based on the composite output signal; and
the control circuitry is further adapted to implement one or more other phase adjustments to increase the power level of the composite output signal.

16. The invention of claim 13, wherein the control circuitry is adapted to apply the initial phase-adjustment mode to one or more of the amplifiers for a specified number of iterations followed by application of the subsequent phase-adjustment mode to the one or more amplifiers for an indefinite number of iterations.

17. The invention of claim 13, wherein, for each iteration of each phase-adjustment mode for each amplifier:
the control circuitry is adapted to measure feedback signals at an initial phase setting, a reduced phase setting, and an increased phase setting; and
the control circuitry is adapted to select an updated phase setting for the amplifier based on the measured feedback signals.

18. The invention of claim 17, wherein the control circuitry is adapted to select the updated phase setting associated with a lowest measured return loss, when the feedback signals are based on a return loss for the corresponding amplifier.

19. The invention of claim 18, wherein the control circuitry is adapted to select the updated phase setting associated with a highest measured composite output signal power level, when the feedback signals are based on the composite output signal.

20. The invention of claim 13, wherein, for each iteration of each phase-adjustment mode for each amplifier, the amplifier is adapted to transmit information related to the amplifier to one or more other amplifiers.

21. The invention of claim 20, wherein the information is based on a return loss for the amplifier.

22. The invention of claim 13, wherein the control circuitry is adapted to skip phase adjustment during the subsequent phase-adjustment mode for each amplifier that is performing better than any other of the amplifiers, the control circuitry is adapted to determine that a first amplifier is performing better a second amplifier when a return loss for the first amplifier is less than a return loss for the second amplifier.

23. The invention of claim 13, wherein the control circuitry is adapted to apply phase adjustment to the digital input signal at baseband in a digital domain prior to application to the corresponding amplifier.

24. The invention of claim 13, wherein, for each amplifier adapted to adjust phase, the system comprises:
a directional coupler connected between an output of the amplifier and a corresponding input of the combiner;
an isolator connected between the output of the amplifier and the corresponding input of the combiner;
a switch connected to the directional coupler and to an output of the isolator;
a receiver connected to an output of the switch; and a processor connected to an output of the receiver, wherein:
the directional coupler is adapted to forward a portion of the amplified signal from the amplifier to a first input of the switch;
the isolator is adapted to forward a reflected signal from the combiner to a second input of the switch;
the switch is adapted to selectively forward the amplified signal portion and the reflected signal to the receiver;
the receiver is adapted to measure power levels of the amplified signal portion and the reflected signal; and
the processor is adapted to adjust the phase of the digital input signal based on a return loss derived from the power levels.

25. The invention of claim 24, wherein the processor is adapted to select a plurality of different phase settings and select the phase setting associated with the lowest measured return loss as an updated phase setting for the corresponding amplifier.

26. A method for generating a composite output signal using a plurality of digital-input amplifiers configured in parallel, the method comprising:
applying a digital input signal to each of the amplifiers to generate an amplified signal;
combining the amplified signal from each of the amplifiers to generate the composite output signal; and
adjusting phase of the amplified signal generated by each of one or more of the amplifiers based on one or more feedback signals associated with the combining, wherein:
a first feedback signal is based on the composite output signal; and
one or more other phase adjustments are adapted to increase the power level of the composite output signal.

27. The invention of claim 26, wherein:
a second feedback signal is based on a return loss for an amplifier; and
one or more phase adjustments are adapted to reduce the return loss for the amplifier.

28. A method for generating a composite output signal using a plurality of digital-input amplifiers configured in parallel, the method comprising:
applying a digital input signal to each of the amplifiers to generate an amplified signal;
combining the amplified signal from each of the amplifiers to generate the composite output signal; and
adjusting phase of the amplified signal generated by each of one or more of the amplifiers based on one or more feedback signals associated with the combining, wherein phase adjustment is applied to the digital input signal at baseband in a digital domain prior to application to the corresponding amplifier.

29. An amplifier system comprising:
a plurality of digital-input amplifiers, each adapted to generate an amplified signal based on a digital input signal;
a combiner adapted to receive the amplified signals from the amplifiers and generate a composite output signal; and
control circuitry adapted to adjust phase of one or more of the amplified signals based on one or more feedback signals from the combiner, wherein:
a first feedback signal is based on the composite output signal; and
the control circuitry is further adapted to implement one or more other phase adjustments to increase the power level of the composite output signal.

30. The invention of claim 29, wherein:
a second feedback signal is based on a return loss for an amplifier; and
the control circuitry is adapted to implement one or more phase adjustments to reduce the return loss for the amplifier.

31. An amplifier system comprising:
a plurality of digital-input amplifiers, each adapted to generate an amplified signal based on a digital input signal;
a combiner adapted to receive the amplified signals from the amplifiers and generate a composite output signal; and
control circuitry adapted to adjust phase of one or more of the amplified signals based on one or more feedback signals from the combiner, wherein the control circuitry is adapted to apply phase adjustment to the digital input signal at baseband in a digital domain prior to application to the corresponding amplifier.

32. An amplifier system comprising:
a plurality of digital-input amplifiers, each adapted to generate an amplified signal based on a digital input signal;
a combiner adapted to receive the amplified signals from the amplifiers and generate a composite output signal; and
control circuitry adapted to adjust phase of one or more of the amplified signals based on one or more feedback signals from the combiner, wherein:
for each amplifier adapted to adjust phase, the system comprises:
a directional coupler connected between an output of the amplifier and a corresponding input of the combiner;
an isolator connected between the output of the amplifier and the corresponding input of the combiner;
a switch connected to the directional coupler and to an output of the isolator;
a receiver connected to an output of the switch; and
a processor connected to an output of the receiver, wherein:
the directional coupler is adapted to forward a portion of the amplified signal from the amplifier to a first input of the switch;
the isolator is adapted to forward a reflected signal from the combiner to a second input of the switch;
the switch is adapted to selectively forward the amplified signal portion and the reflected signal to the receiver;
the receiver is adapted to measure power levels of the amplified signal portion and the reflected signal; and
the processor is adapted to adjust the phase of the digital input signal based on a return loss derived from the power levels.

33. The invention of claim 32, wherein the processor is adapted to select a plurality of different phase settings and select the phase setting associated with the lowest measured return loss as an updated phase setting for the corresponding amplifier.

* * * * *